United States Patent
Fure et al.

(10) Patent No.: US 7,284,213 B2
(45) Date of Patent: Oct. 16, 2007

(54) DEFECT ANALYSIS USING A YIELD VEHICLE

(75) Inventors: Jan Fure, Milwaukie, OR (US); Richard Schultz, Fort Collins, CO (US); Derryl Allman, Camas, WA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/247,517

(22) Filed: Oct. 11, 2005

(65) Prior Publication Data

US 2006/0226847 A1    Oct. 12, 2006

Related U.S. Application Data

(60) Provisional application No. 60/669,646, filed on Apr. 8, 2005.

(51) Int. Cl.
*G06F 17/50* (2006.01)
(52) U.S. Cl. .............................. 716/4; 716/19; 716/21
(58) Field of Classification Search .................. 716/1, 716/4, 19, 21
See application file for complete search history.

(56) References Cited

U.S. PATENT DOCUMENTS

| | | | |
|---|---|---|---|
| 5,299,204 A | 3/1994 | Daniel | |
| 5,674,651 A | 10/1997 | Nishi | |
| 6,092,223 A | 7/2000 | Ahn | |
| 6,436,741 B2 | 8/2002 | Sato et al. | |
| 6,483,176 B2 | 11/2002 | Noguchi et al. | |
| 6,707,064 B2 | 3/2004 | Jang et al. | |
| 6,781,151 B2 | 8/2004 | Schultz et al. | |
| 6,861,864 B2 * | 3/2005 | Schultz | 324/765 |
| 6,885,950 B2 * | 4/2005 | Mitsutake et al. | 702/58 |
| 2004/0031008 A1 | 2/2004 | Satoh et al. | |

* cited by examiner

*Primary Examiner*—Thuan Do
(74) *Attorney, Agent, or Firm*—Krajec Patent Offices (57) ABSTRACT

A system and method for collecting and analyzing optical inspection results obtained during the manufacturing process and comparing those results to actual functional results of a specially designed test vehicle integrated circuit. The test vehicle integrated circuit allows failures to be localized to very small areas, which allows more accurate correlation between inspection faults and functional failures. The correlation of inspection faults to actual functional failures is used to change the sensitivity settings for an optical inspection system to more accurately detect defects that are likely to be functional failures.

20 Claims, 8 Drawing Sheets

DEFECT ANALYSIS USING A YIELD VEHICLE

CROSS REFERENCE TO RELATED APPLICATIONS

This application claims the benefit of and priority to U.S. Provisional Application entitled "Methodology for Converting Electrical Failure Data to a Graphical Depiction of Potential Physical Defects" by Jan Fure, Richard Schultz, and Derryl Allman on Apr. 8, 2005, Ser. No. 60/669,646, the entire contents of which are hereby expressly incorporated by reference.

BACKGROUND OF THE INVENTION a. Field of the Invention

The present invention pertains generally to processing integrated circuits and specifically to analyzing data from a test vehicle for process improvement and control.

b. Description of the Background

The miniaturization of integrated circuits is progressing at a very fast pace. As integrated circuits become smaller and smaller, much of the development effort is devoted to developing efficient and reliable inspection tools.

Optical testing is often performed during various stages of the manufacturing process of an integrated circuit in order to monitor the manufacturing process. This type of nondestructive testing may identify defects that may or may not cause an integrated circuit to fail. The accuracy of these inspection tools is important to produce quality product with good yields. If the inspection tools identify too many defects that do not cause functional failures, otherwise good integrated circuits may be rejected causing yields to drop. If the inspection tools miss some defects that cause the circuit to fail, opportunities for yield improvement may be lost.

It would therefore be useful to provide a system and method for analyzing the performance of optical inspection of integrated circuits. It would also be useful if such a system were able to provide some calibration feedback to the optical inspection system.

SUMMARY OF THE INVENTION

The present invention provides a system and method for collecting and analyzing optical inspection results obtained during the manufacturing process and comparing those results to actual functional results of a specially designed test vehicle integrated circuit. The test vehicle integrated circuit allows failures to be localized to very small areas, which allows more accurate correlation between inspection faults and functional failures. The correlation of inspection faults to actual functional failures is used to change the sensitivity settings for an optical inspection system to more accurately detect defects that are likely to be functional failures.

An embodiment may include a system comprising: an optical test device capable of nondestructive inspection of an integrated circuit during the manufacturing process of the integrated circuit, the optical test device having a sensitivity threshold setting for identifying an inspection fault; a test vehicle integrated circuit comprising a plurality of test circuits and at least one switching circuit adapted to switch one or more of the test circuits to a set of input and output connections, the test vehicle having been inspected by the optical test device and having generated a set of inspection faults; a functional test device capable of functionally testing the test vehicle integrated circuit and producing a set of functional faults; and an analysis device adapted to determine a physical location of the functional faults, determine a physical location of the inspection faults, and display the functional faults and the inspection faults graphically on the same diagram.

Another embodiment may include a method comprising: manufacturing a test vehicle integrated circuit comprising a plurality of test circuits and at least one switching circuit adapted to switch one or more of the circuits to a set of input and output connections; performing at least one nondestructive inspection of the test vehicle circuit during the manufacturing to generate a set of inspection faults, the nondestructive inspection being performed by an optical test device having a sensitivity threshold setting for identifying an inspection fault; performing at least one functional test of the test vehicle using a functional test device to generate a set of functional faults; and displaying a physical location for the set of inspection faults and a physical location for the set of the functional faults graphically.

Yet another embodiment may include an analysis tool comprising: a first input adapted to receive a set of nondestructive inspection data for a test vehicle integrated circuit, the set of nondestructive inspection data being collected during the manufacturing process of the test vehicle integrated circuit and comprising inspection faults determined using a sensitivity threshold for identifying the inspection faults, the test vehicle integrated circuit comprising a plurality of test circuits and at least one switching circuit adapted to switch one or more of the test circuits to a set of input and output connections; a second input adapted to receive a set of functional test data for the test vehicle integrated circuit, the set of functional test data comprising functional faults; and an analysis engine adapted to determine a physical location for a plurality of the inspection faults, determine a physical location for a plurality of the functional faults, and display the physical location of the plurality of the inspection faults and the physical location of the plurality of the functional faults together on a graphical display.

The advantages of the present invention include the ability to accurately and quickly correlate optical inspection results with actual functional failures. The area of probable failure of a functional failure can be more accurately pinpointed than with other circuits, allowing a much higher correlation between inspection defects and functional failures. Because of a higher correlation, destructive failure analysis tests are much more likely to find the actual defect that caused a circuit failure, lowering failure analysis costs and improving confidence in the inspection results.

DETAILED DESCRIPTION OF THE INVENTION

Specific embodiments of the invention are described in detail below. The embodiments were selected to illustrate various features of the invention, but should not be considered to limit the invention to the embodiments described, as the invention is susceptible to various modifications and alternative forms. The invention is to cover all modifications, equivalents, and alternatives falling within the spirit and scope of the invention as defined by the claims. In general, the embodiments were selected to highlight specific inventive aspects or features of the invention.

Throughout this specification, like reference numbers signify the same elements throughout the description of the figures.

When elements are referred to as being "connected" or "coupled," the elements can be directly connected or coupled together or one or more intervening elements may also be present. In contrast, when elements are referred to as being "directly connected" or "directly coupled," there are no intervening elements present.

The invention may be embodied as devices, systems, methods, and/or computer program products. Accordingly, some or all of the invention may be embodied in hardware and/or in software (including firmware, resident software, micro-code, state machines, gate arrays, etc.) Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. By way of example, and not limitation, computer readable media may comprise computer storage media and communication media.

Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an instruction execution system. Note that the computer-usable or computer-readable medium could be paper or another suitable medium upon which the program is printed, as the program can be electronically captured, via, for instance, optical scanning of the paper or other medium, then compiled, interpreted, of otherwise processed in a suitable manner, if necessary, and then stored in a computer memory.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

When the invention is embodied in the general context of computer-executable instructions, the embodiment may comprise program modules, executed by one or more systems, computers, or other devices. Generally, program modules include routines, programs, objects, components, data structures, etc. that perform particular tasks or implement particular abstract data types. Typically, the functionality of the program modules may be combined or distributed as desired in various embodiments.

Throughout this specification, the term "comprising" shall be synonymous with "including," "containing," or "characterized by," is inclusive or open-ended and does not exclude additional, unrecited elements or method steps. "Comprising" is a term of art which means that the named elements are essential, but other elements may be added and still form a construct within the scope of the statement. "Comprising" leaves open for the inclusion of unspecified ingredients even in major amounts.

Figure 1:
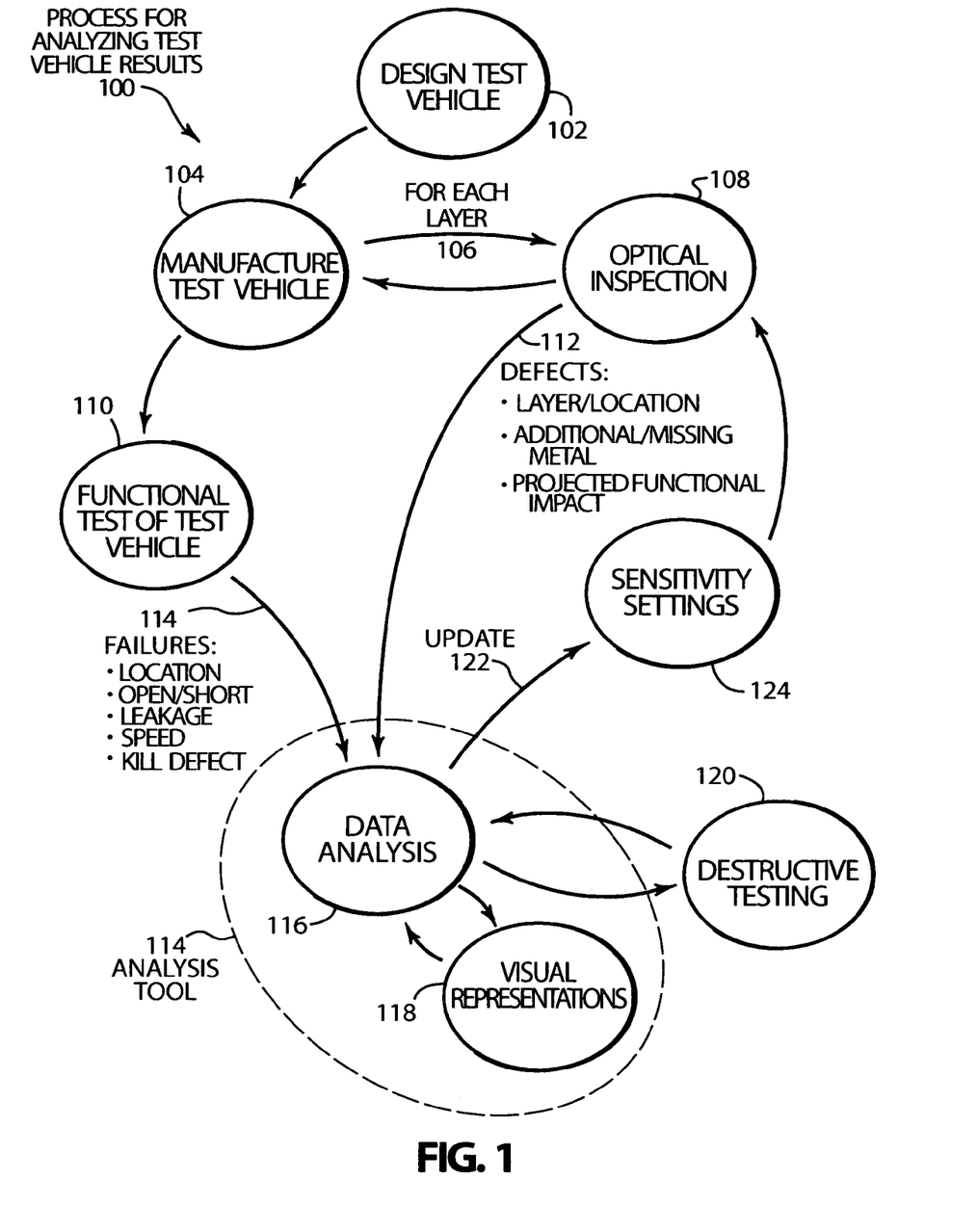
FIG. 1 is a diagrammatic representation of a system and process for analyzing test vehicle results.

FIG. 1 is a diagrammatic illustration of an embodiment 100 showing a process for analyzing test vehicle results. After designing the test vehicle 102, the vehicle is manufactured 104. For each layer 106 in the manufacturing process, an optical inspection 108 is performed. After manufacturing 104, a functional test 110 of the test vehicle is performed. Defects 112 from the optical inspection 108 and failures 114 from the functional test 110 are transmitted to the analysis tool 114 and specifically to the data analysis engine 116. After analyzing the data, visual representations 118 are produced. Additionally, destructive testing 120 may be performed on some data points. The analysis tool 114 may provide an update 122 to the sensitivity settings 124 that are used by the optical inspection 108.

Embodiment 100 is a method by which optical inspection data may be accurately compared and correlated to actual failure data. A specialized test vehicle is used that allows very precise location of failures so that an optical defect may be readily matched with a failure. In a typical integrated circuit, any given failure in a circuit may be spread over a large physical area such that locating the optical defect that caused the failure may be very time consuming and ultimately inaccurate. Further, a typical circuit may include many circuit paths over many layers. A specialized test vehicle, an embodiment of which is described below, will generally be able to isolate failures to very confined physical location and across a small number of circuit elements. Thus, optical defects that cause functional failures are quickly and accurately identified.

The integrated circuit manufacturing process 104 may include building up several layers of metal traces. During the manufacturing process 104, each layer may be optically inspected 108. The optical inspection 108 may include any type of microscopy, including light microscopy, scanning electron microscopy, X-ray, or any other sensing mechanism that uses a visual or graphic image to perform an inspection.

In some cases, the optical inspection may be capable of inspecting the top layer of a partially manufactured integrated circuit. In other cases, multiple layers may be inspected at one time, such as when X-ray or other radiation source may be used. For the purposes of this specification, the term "optical test" shall encompass all of these types of inspection tools.

The optical inspection 108 may use a set of sensitivity settings to determine whether an abnormality is classified as a defect or not. Sensitivity settings, sometimes known as threshold settings, may be used to classify a defect as too much metal, missing metal, a scratch, or any other type of defect. Separate sensitivity settings may be used to classify each type of defect.

In some embodiments, the optical inspection 108 may provide some projection as to the functional impact of a defect. For example, a defect having excess metal may form a bridge between two traces. Such a defect may be classified as a short, while a missing metal defect may be classified as an open.

The functional test of the test vehicle 110 may provide one or more different functional tests of the manufactured circuits. For example, a basic continuity test may identify opens and shorts. Resistance tests may measure leakage currents, and various functional speed tests may measure other functional parameters. The functional test 110 may also identify kill defects, or those failures that prevent the circuit from functioning. In some cases, a circuit may perform sub-optimally but still may be at least marginally functional.

The analysis tool 114 incorporates a data analysis mechanism 116 as well as a visual representation mechanism 118. The analysis tool 114 may correlate the optical test results 112 and the functional test results 114 and update 122 the sensitivity settings 124 of the optical test device 108. The correlation and analysis of optical defects 112 and functional failures 114 may give very accurate and meaningful insights into the performance of the manufacturing processes as well as the optical inspection 108.

In many integrated circuit manufacturing processes, optical inspection 108 is one of the most used tools for process monitoring. If the optical inspection system detects too many failures on a die, a significant amount of time may be spent chasing manufacturing problems that do not affect the performance of the circuitry. If the optical inspection system does not detect a failure that is present, areas where the manufacturing process needs improvement may not be detected until after the circuit is completed and undergone electrical tests. Accurate and reliable optical inspection results are very valuable to manufacturers of integrated circuits to ensure a healthy manufacturing process.

In many cases, data analysis 116 may include destructive testing 120 to verify that an optical defect is indeed the cause of a functional failure. In some cases, a sample of defects may be analyzed using destructive failure analysis testing to verify the correlation between optical defects and functional failures. The test vehicle integrated circuit enables very precise location of a failure, making destructive testing much more efficient than when a functional failure may be spread across a large area as with a typical production integrated circuit.

Figure 2:
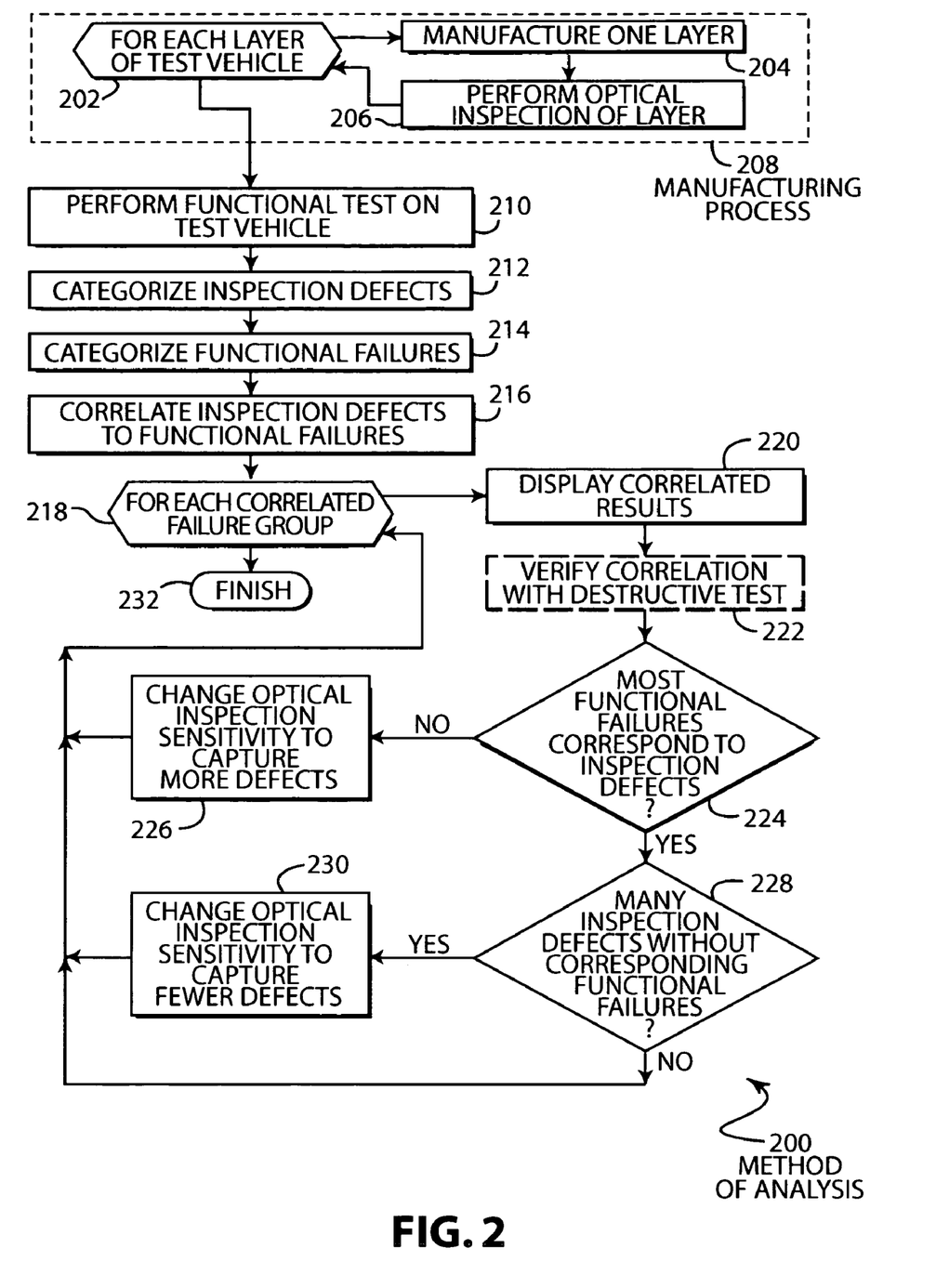
FIG. 2 is a flowchart representation of a method of analysis.

FIG. 2 is a flowchart illustration of an embodiment 200 of a method of analysis. For each layer of a test vehicle in block 202, a layer is manufactured in block 204 and an optical inspection is performed on that layer in block 206. After repeating the process for every layer in the integrated circuit, the manufacturing process 208 is completed. A functional test is performed on the test vehicle in block 210. The inspection defects are categorized in block 212 and the functional failures are categorized in block 214. The inspection defect and functional failures are correlated in block 216.

For each correlated group failure group in block 218, the results are displayed in block 220 and the correlation may be verified with destructive testing in block 222. If most of the functional failures do not correspond with inspection defects in block 224, the optical inspection sensitivity is changed to capture more defects in block 226. If there are too many inspection defects without corresponding functional failures in block 228, the optical inspection sensitivity is changed to capture fewer defects in block 230. After each correlated failure group is analyzed in block 218, the process terminates in block 232.

During the manufacturing process 208, optical inspection results are captured. These results are combined with the functional test results and analyzed to see if changes are necessary to the optical inspection sensitivity settings. These changes may then be used for production of other integrated circuits.

The categorization and correlation of the inspection defects and functional failures occurs in blocks 212, 214, and 216. Inspection defects may be categorized into various categories, such as extra metal, missing metal, scratches, and other types of gross defects. The inspection defects may be further classified into defects such as bridges, opens, thin traces, or other defects that may predict a certain type of functional failure. For example, a bridge between two adjacent circuit traces may indicate a potential short while an inspection open may indicate a potential functional open. In some cases, the location and severity of a inspection defect may be a kill defect, which is a defect that causes the circuit to fail a functional test. In many cases, an inspection defect may be detected but may not cause a kill failure.

Several subgroups of test results come from correlating functional failures and inspection defects. For example, optically observed thin traces may be correlated to speed failures or leakage failures from the functional test. Open failures observed during functional test may correspond with open failures during optical inspection. Other groupings and correlations of optical inspection defects and functional failures may also be made.

As one skilled in the art will appreciate, the functional tests, functional failure results, optical inspection results, and other parameters discussed in this specification are for illustrative purposes and are not meant to be limiting. They are selected to illustrate the principles of the invention, but are not comprehensive. Other applications may use different parameters, labels, correlations, etc. while keeping within the spirit and intent of the present invention.

After forming groups of optical inspection defects and functional failures, the correlation between the inspection defects and functional failures is analyzed individually. In many cases, a sample of destructive failure analysis tests may be performed in block 222 to ensure that the correlation between the two categories is correct. Using various statistical methods, the correlation between the two categories can be compared in blocks 224 and 228 to determine if the optical inspection criteria are appropriate for the specific category.

Any type of statistical analysis may be used to determine if the correlation between the functional failures and inspection defects is proper. In some cases, a t-test or other type of statistical analysis may be used, while in other cases a simple percentage tolerance may be used. For example, if a certain percentage of the functional failures correspond to inspection defects, the optical inspection parameters may be acceptable. In a different analysis, confidence intervals or other statistical tools may be used to determine if the optical inspection parameters are proper.

The optical inspection sensitivity settings of blocks 226 and 230 may apply only to the specific type of defect, or may apply to several types of defects. For example, the optical defects of a thin trace or an open may contribute to a functional defect of an open circuit. Thus, when open circuits are being missed by the optical inspection in block 224, the optical inspection parameters of both thin traces and opens may be adjusted in block 226. Similarly, a single type of optical defect may correspond to two or more functional failures. For example, an excess metal or bridging defect may contribute to a short as well as a low resistance during leakage testing. Thus, bridging defects may be correlated with both short failures and leakage failures.

Figure 3:
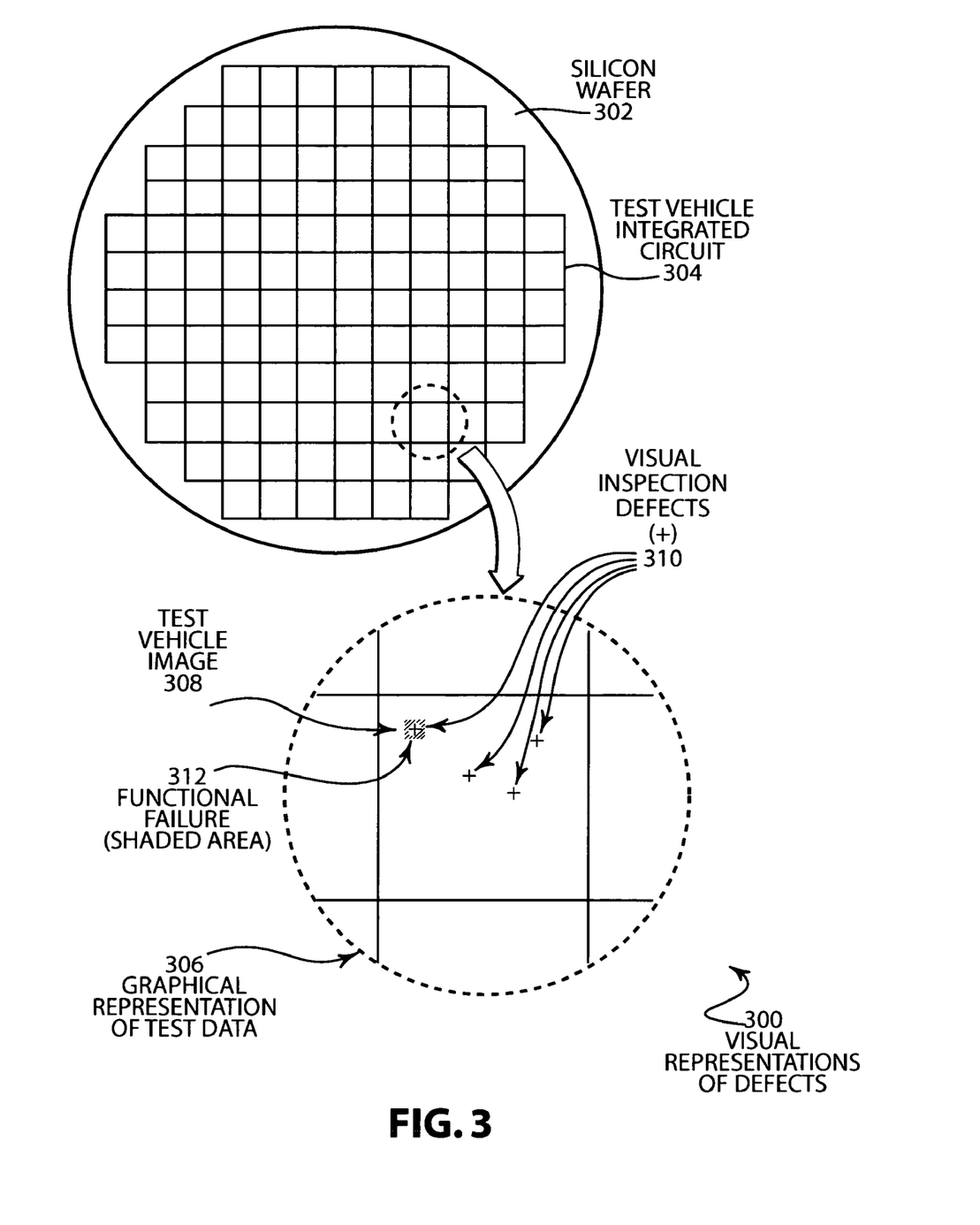
FIG. 3 is a diagrammatic representation of a visual representation of defects.

FIG. 3 is a diagrammatic illustration of an embodiment 300 showing a visual representation of defects. A silicon wafer 302 may be manufactured with many test vehicle integrated circuits 304. During the manufacturing process, visual inspection defects are captured using optical inspection equipment. After manufacturing, functional test failures are found using functional test equipment. After manufacturing and test, a graphical representation of the test data 306 may include an image of the test vehicle 308, locations of physical defects 310, as well as areas of functional failure 312.

Functional failures 312 can be isolated only to the portion of a circuit where a problem exists. Thus, a functional failure on the test vehicle image 308 may be represented as a shaded area of the circuitry 312. A test vehicle may be designed so that functional failures can be readily isolated by being located in a very small area.

The functional failure 312 is located in an area that contains an optical inspection defect 310. Because an optical defect is located in the same place as the functional failure 312, destructive or non-destructive failure analysis may be used to see if that optical defect was the cause of the functional failure 312. The finer that a functional failure can be isolated, the more likely it may be that a specific optical failure was the cause, and the more accurately the optical inspection can be tuned to identify defects that are most likely to cause functional failures.

In the representation 306, the number of visual defects 310 is in excess of the number of functional failures 312. Many of the visual defects 310 do not correspond with any functional failure. Given this situation, the threshold parameters of the optical test system may be adjusted to be less sensitive.

Many other graphical diagrams may be useful in helping an analyst correlate the functional failures with inspection defects. For example, bar charts, histograms, line graphs, or any other visual representation of both sets of data may be used. Such representations may help an analyst determine which types of failures tend to result in kill defects and thus may be further researched for process improvements, for example. In another example, a bar chart may include the types of functional failures and the correlated optical inspection defects estimated to have caused each type of failure.

Many different visual representations of the data may be used. Bar charts, scatter charts, and other correlations may help identify certain processing or design parameters that need additional investigation. Such charts may include the correlated optical defects and functional failures for a specific circuit path, or may summarize the data from several circuits. Some physical representations of the data may include a single layer representation showing only the functional failures and inspection defects for that specific layer of the integrated circuit. Other such representations may include the data from several layers. Those skilled in the art may use any available visual representation of the correlated data that may be useful.

Figure 4:
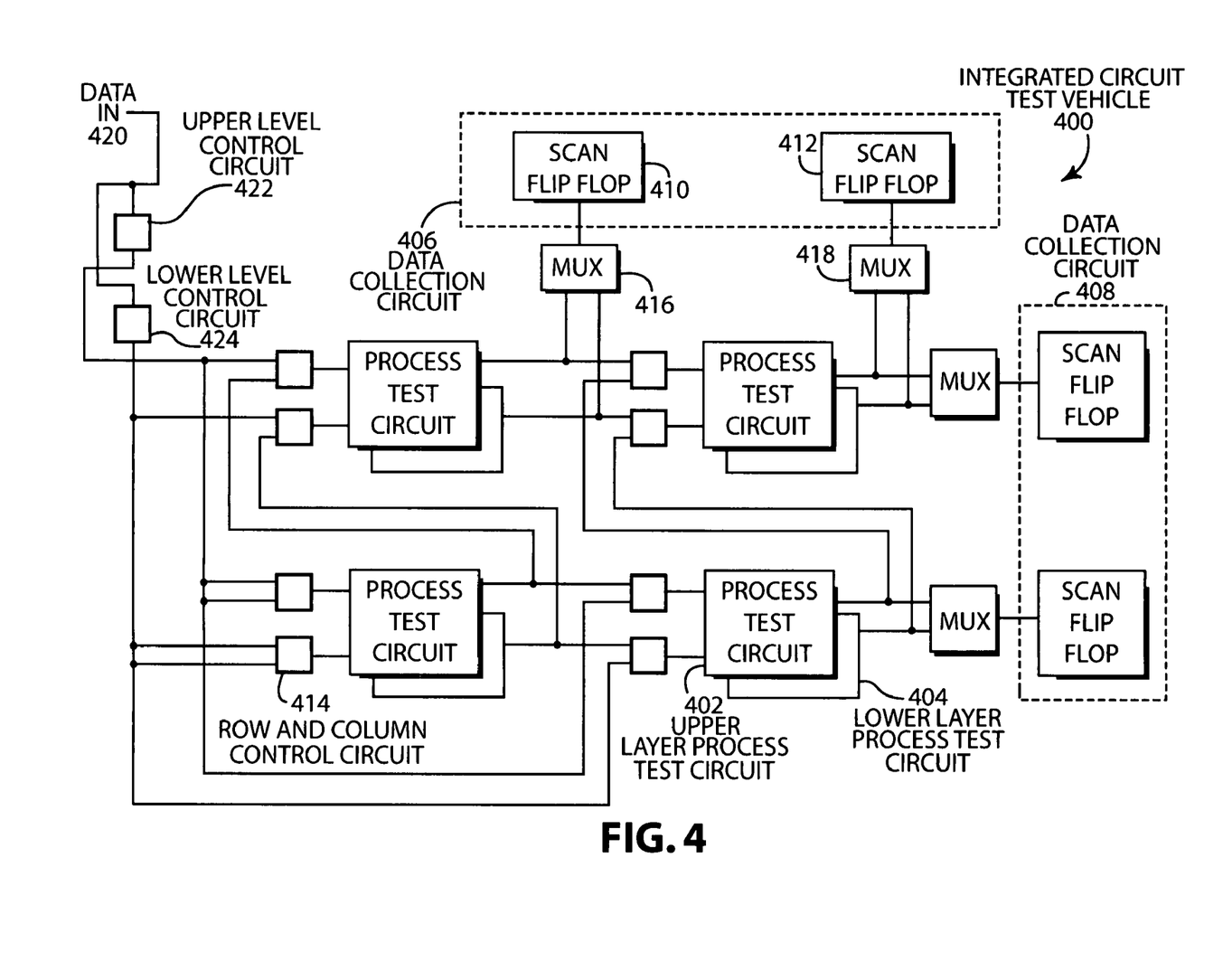
FIG. 4 is a block diagram representation of an integrated circuit test vehicle.

FIG. 4 is a flowchart illustration of an embodiment 400 showing an integrated circuit test vehicle. Four upper layer process test circuits 402 and four lower layer process test circuits 404 are arranged in a 2×2 matrix. Data collection circuit 406 may be used to collect data when the process test circuits are connected in columns while data collection circuit 408 is similarly used when the process test circuits are connected in rows. The data collection circuit 406 comprises scan flip flops 410 and 412.

The row and column control circuits 414 may be arranged so that the process test circuits may be connected in series along the rows or columns of the 2×2 matrix. Additionally, the upper layer or lower layer sets of process test circuits may be selected by the muxes 416 and 418.

DataIn line 420 is input into the process test circuits through the row and column control circuits 414 and enters the columns in parallel. Alternatively, the data 420 may be switched so that it enters the rows in parallel. The switches 422 and 424 control the flow into either the upper layer process test circuits or the lower layer process test circuits.

In some embodiments, the process test circuits may be arranged in a large array of 10, 20, or 100 or more columns and rows. Some may be square matrices, with equal number of rows and columns, while others may have unequal numbers of rows and columns.

Process test circuits may be arranged in several layers within the integrated circuit. For example, one process test circuit may be formed in the first two or three layers of the integrated circuit, while a second process test circuit may be formed in the next two or three layers. In such an example, the process test circuits in the bottom layer may be connectable in one array while the upper layer process test circuits may be connectable in a second array. The embodiment 400 is such an example, with the muxes 416 and 418 being used to select one array over the other while the switches 422 and 424 direct the data to flow into the appropriate array. In other examples, three, four, or even more process test circuits may be layered on top of each other.

The process test circuits may be any type of test circuit usable to test the boundaries of an integrated circuit manufacturing process. For example, 'comb' circuits are known in the art. Additionally, serpentine circuits may contain a single trace of minimum width that is placed at a minimum spacing in a very long trace. Another example is a stair-step test circuit that contains many vias and connections up and down through several layers of the integrated circuit. Many different circuits are known in the art and may be developed in the future for testing process parameters. In many cases, process test circuits may include test points or other features that enable quick identification of problem areas so that a failure analysis engineer may efficiently isolate and analyze a failure.

The size of the process test circuits may vary from embodiment to embodiment. The actual size may be determined by company or industry standards, by personal preference, by the optimal size to fit on a tester or wafer, or by any other criteria.

The data collection circuits 406 and 408 may collect and store the signal data during a test. In one configuration, a set of scan flip flops may be used to store a plurality of parallel incoming data signals then send the data value to a host when a scan is initiated. In such a configuration, the data may be read in a series of bits. In another configuration, the data collection circuits may receive, process, and store incoming data signals one at a time. Such a configuration may be useful for testing several rows or columns in parallel. Some configuration may allow for all or a portion of the rows or columns to be tested in parallel. For example, a data collection circuit may allow eight rows or columns to be tested in parallel but may have 24 or more rows or columns.

The data collection circuits may collect, store, and process the data that passes through the process test circuits through any of a number of configurations. The configuration may depend on the number of data bits, the type of information to be stored, the interface used to collect the data, and other factors. Those skilled in the art may configure the data collection circuits 406 and 408 in various manners to suit the particular embodiment. In some embodiments, the data collection circuits 406 and 408 may be combined into a single data collection circuit that is switchably connected to receive data transmitted along the row or column direction of the array of process test circuits.

The circuits of embodiment 400 may be replicated many times over an entire integrated circuit wafer. In many cases, a designer may find it useful to design a standardized array of N×N process test circuits into a test cell. The test cell may be replicated in a larger array with several different forms, such as with varying trace widths or other parameter, or with completely different process test circuits. The array of test cells may be further replicated over the surface of an entire wafer.

In some instances, there is an advantage to manufacturing an entire wafer of test cells, each containing many test circuits such as embodiment 400. For example, process variation across a wafer may be characterized and analyzed. Further, such a wafer may yield a very large number of data points for process test data in a single wafer.

In some instances, the circuit 400 may be placed on a portion of a wafer that is used to manufacture other circuits. The circuit 400 may be tested on every wafer or sampled over many wafers to determine if certain process parameters are being properly controlled.

Figure 5:
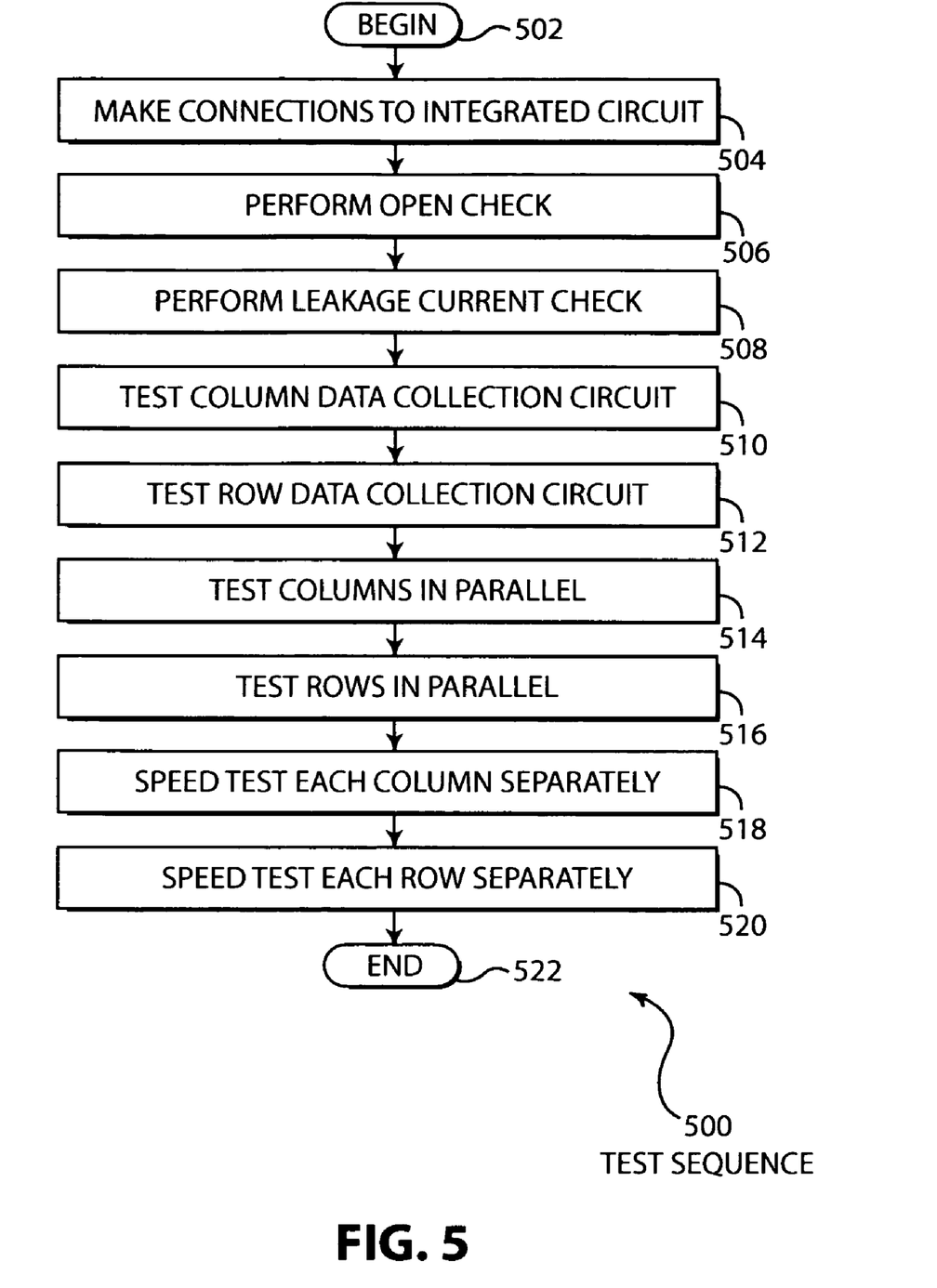
FIG. 5 is a flow chart representation of a method of a test sequence.

FIG. 5 illustrates an embodiment 500 of a test sequence used to test the circuit 400. The process begins in block 502. After physical probe connections are made to the integrated circuit in block 504, an open check is performed in block 506 as well as a leakage current check in block 508. The column data collection circuit is tested in block 510 and the row data collection circuit is tested in block 512. The columns and rows are tested in parallel in blocks 514 and 516. Each column is tested separately in a 'speed test' in block 518, and likewise each row is speed tested in block 520. The process ends in block 522.

The testing and analysis of test results will be discussed in two parts for the purposes of this specification. In some embodiments, a test apparatus may be capable of collecting test data that is subsequently evaluated on the same or another system. In some cases, the evaluation and analysis of data may be performed on a general purpose computer running data analysis programs. In other embodiments, the data collection and analysis may be performed substantially simultaneously on one system.

The test sequence may include preliminary tests, tests conducted in parallel, and tests conducted separately. The preliminary tests may include open checks as in block 506, leakage current check as in block 508, and testing the data collection circuits as in blocks 510 and 512. Depending on the test apparatus, the design of the test vehicle, processing and switching capabilities of the test apparatus and test vehicle, company standards, preferences of the testing engineer, or other factors, the particular preliminary tests and test sequences may be varied while keeping within the spirit and intent of the present invention.

An open check and leakage current check as in blocks 506 and 508 may test the connections and gross operational level of the test vehicle. In some embodiments, if the open check and leakage current check are not satisfactory, the testing procedure may be halted, while in others, the test may continue. As described hereinafter, a failure in an open check or leakage current check may taint the test results of some process test circuits. Such test results may be ignored so that they do not corrupt the overall analysis.

The column and row data collection circuits may be tested in blocks 510 and 512. These circuits may have a self test feature or may have a method by which the data collection circuits may be at least partially isolated and tested for proper operation. The specific method of testing and the data collected from such a test is dependent on the design of the data collection circuit, and may vary from one embodiment to another. The purpose of the data collection tests of blocks 510 and 512 is to perform at least a cursory verification that the circuits are functional. In some embodiments, the data collection circuits may not be independently testable at all, and thus such tests may not be performed.

The rows and columns of the array of process test circuits may be tested in parallel in some embodiments as in blocks 514 and 516. In some embodiments, the data collection circuits may enable all of the rows or columns to be tested simultaneously. In such an embodiment, the process test circuits may be connected to their neighbors so that they are connected in series to form a row or column. Data signals may be sent substantially simultaneously to all of the first process test circuits in the series, and the data may propagate along the rows to the data collection circuits. The array may then be reconfigured and tested along the columns.

In the speed testing of blocks 518 and 520, each column or row may be tested separately and with an emphasis on timing the signal propagation along one row or column at a time. An example of such a method is described in FIG. 6.

Various test sequences may be used by those skilled in the art for generating test data for analysis. Because the process test circuits are able to be tested by two different test paths, a failure in one process test circuit may be isolated by comparing the failures of two intersecting test paths.

Figure 6:
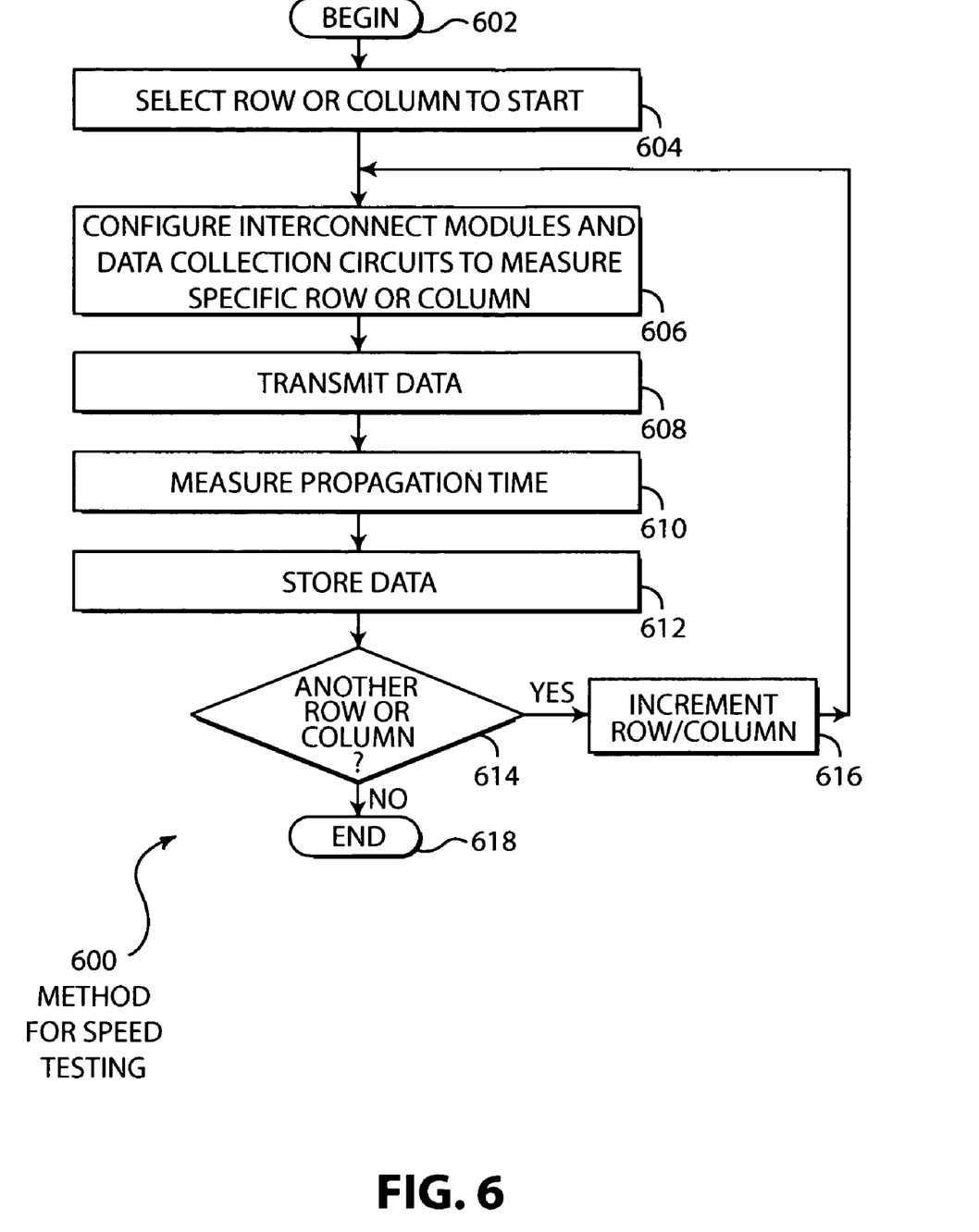
FIG. 6 is a flow chart representation of a method of a speed test.

FIG. 6 illustrates an embodiment 600 of a method for speed testing a single row or column. The process begins in block 602. In block 604, the control circuits and data collection circuits may be configured to measure a specific row or column. The data are transmitted along the row or column in block 608 and the propagation time is measured in block 610. The timing data and propagated data may be stored in block 612. If another row or column is still to be tested in block 614, the row or column is incremented in block 616 and the process continues to block 606, otherwise the process ends in block 618.

In various embodiments, the propagation timing of a signal may or may not be measured. When timing is measured, the data collection circuits may be capable of testing rows or columns of process test circuits simultaneously or separately in the timing tests.

When the data collection circuits are capable of testing only one row or column individually to determine propagation delay through the connected process test circuits, the method 600 is one method for doing so. Each row or column is configured for testing, then data is sent through the array and the propagation delay is determined for that particular row or column.

Figure 7:
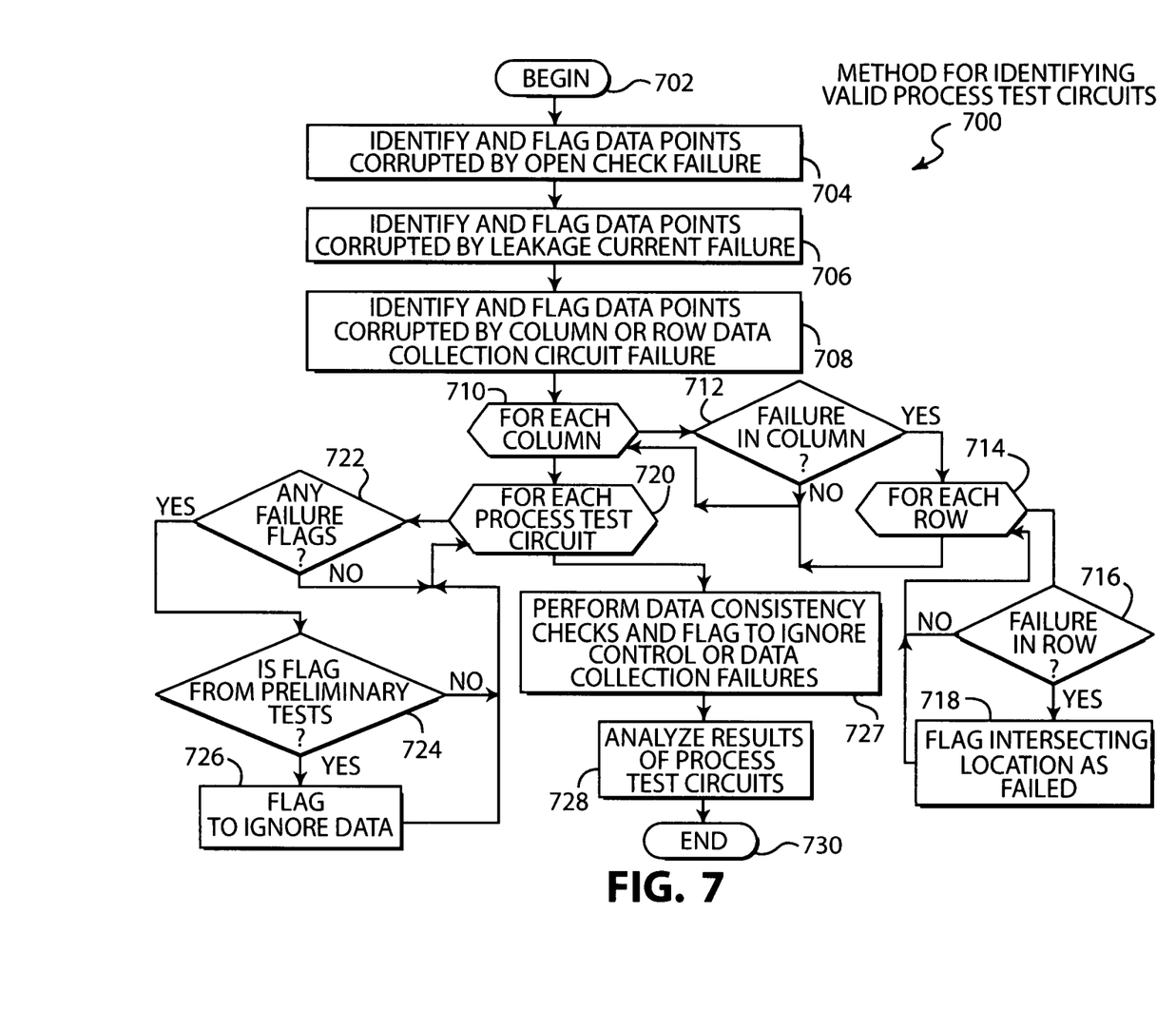
FIG. 7 is a flow chart representation of a method of identifying valid process test circuit failures.

FIG. 7 illustrates an embodiment 700 of a method for identifying valid process test circuit data. The process begins in block 702. Any data points that may be corrupted by open check failures or leakage current failures are identified in blocks 704 and 706, respectively. Similarly, any data points corrupted by data collection circuit failures are identified and flagged in block 708. For each column in block 710, if there is a failure in the column in block 712, the process moves to block 714, otherwise the process continues with the next column in block 710. For each row in block 714, if there is a failure in the row in block 716, the intersecting location is flagged as failed. The process returns to block 714 for the next row.

After each process test circuit or data point has been flagged with any failures, each process test circuit is evaluated in block 720. If there is a failure flagged for the process test circuit in block 722, and in block 724 the flag is from the preliminary tests found in blocks 704, 706, and 708, the data for that process test circuit is flagged to be ignored in block 726. After each process test circuit data point is flagged as either ignore or as good data, data consistency checks may be performed to flag and ignore control or data collection failures in block 727. The results of the tests may be analyzed in block 728. The process ends in block 730.

A failure may be any data that varies from an expected value. In some cases, a data value may have a predefined range. A value outside of the predefined limit may be considered a failure. The data parameter may be any measurable value.

Embodiment 700 illustrates one method for determining in which process test circuit a failure occurred and if that failure is a valid failure. All data points representing process test circuit failures that may be adversely effected by any preliminary test is flagged in blocks 704, 706, and 708. A failure of the data collection circuit or other preliminary tests may create several false failures in the process test circuits. These data points are ignored so that they do not corrupt the final analysis.

Embodiment 700 removes from analysis any process test circuit data that may be corrupted by control circuit failures, data collection failures, or any other non-process test circuit failures. By removing corrupted or doubtful data, the remaining data is much more likely to be reliable process test circuit performance data and less likely to be other failures. The analysis of block 728 may include determining performance characteristics of the process test circuit portions of the yield analysis vehicle.

Another aspect of the embodiment 700 illustrates how failures in individual process test circuits are identified in blocks 710 through 718. Since each process test circuit may have been tested when the data path flows in both the column and row arrangements, a failure of that process test circuit would result in a failure of both the column and row test results. Thus, the intersection of the two orthogonal but failing data paths may be considered a failure.

The arrangement has a significant reduction in both testing time and data analysis time over testing each process test circuit individually. For example, if 100 process test circuits were to be tested, testing each process test circuit individually would require 100 individual tests. Arranging 100 process test circuits in a 10×10 array and testing them in a fashion similar to embodiments 100, 200, 300, and 400 would require only 20 speed tests and two parallel tests, for a total of 22 tests.

A distinct advantage over testing each process test circuit individually is that the failure may be isolated between the process test circuits and the control circuits or the data collection circuits, depending on the design of such circuits and the layout of the test vehicle. Since each data collection circuit is used several times, paired with several different process test circuits in independent tests, a failure can be attributed to either the process test circuit or the data collection and control circuits. The advantage is that failures may be determined with much greater confidence than with other methods. Because of a higher confidence, fewer data points are required for significant results, resulting in fewer test vehicles being needed and less test and analysis time.

Embodiment 700 is merely one example of a method for determining which process test circuit may have failed. In some embodiments, the pass/fail data may be arranged in the form of an address, with the addresses relates to the physical location of a particular process test circuit.

Those skilled in the art will appreciate that many different methods may be used to identify the intersecting process test circuit, including variations of the embodiment 400 or completely different methods.

The data consistency checks of block 727 may be any type of consistency checks that may help isolate data collection and control circuit failures from process test circuit failures. Several examples of such tests are illustrated using the circuit of FIG. 8.

Figure 8:
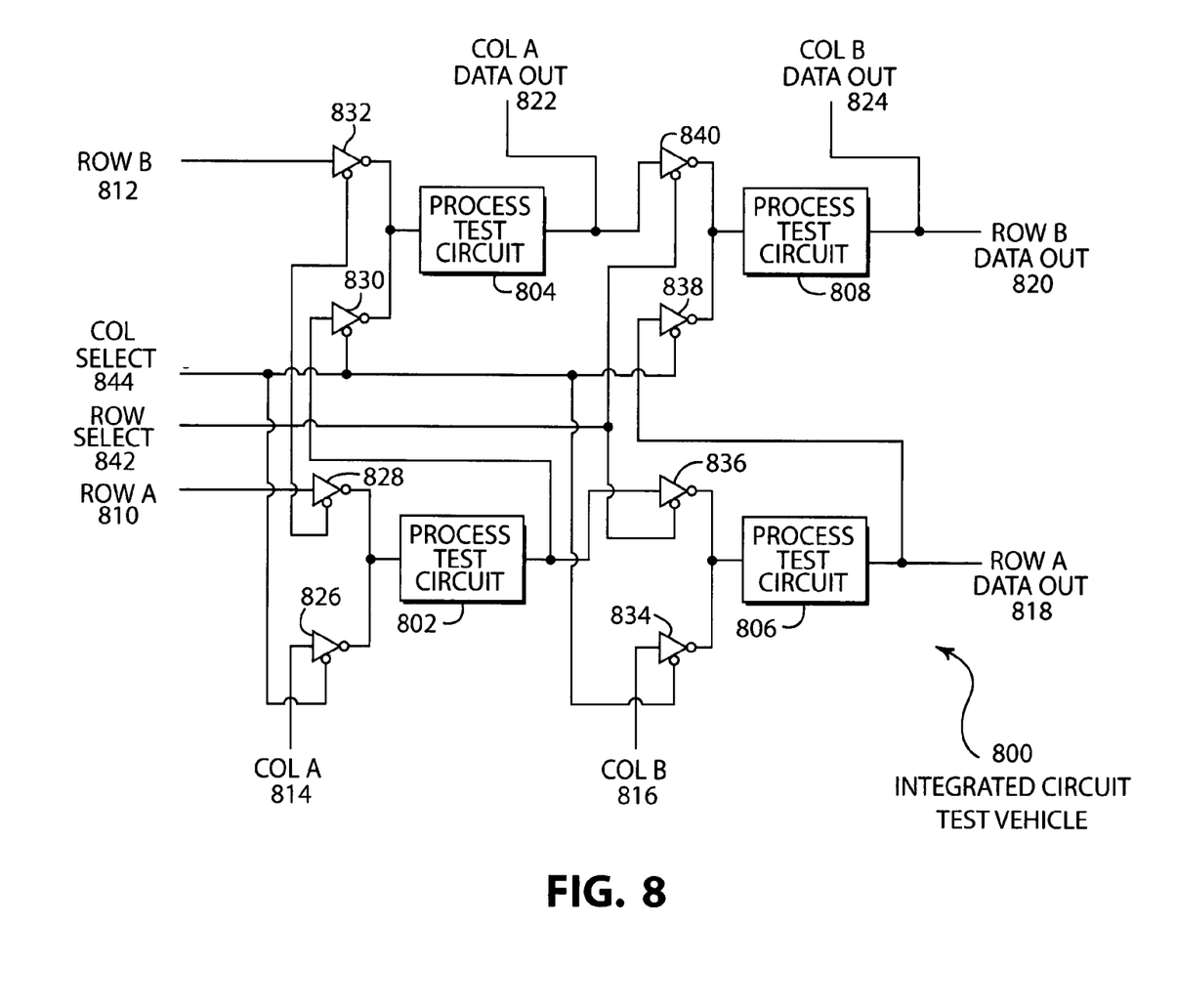
FIG. 8 is a schematic representation of a integrated circuit test vehicle.

FIG. 8 illustrates an embodiment 800 of an integrated circuit test vehicle. The process test circuits 802, 804, 806, and 808 are arranged in a 2×2 array. The data inputs are row A 810, row B 812, column A 814, and column B 516. The data outputs are row A 818, row B 820, column A 822, and column B 824. The tristate inverters 826, 828, 830, 832, 834, 836, 838, and 840 are controlled by row select 842 and column select 844 to allow the flow of data in the row or column arrangement.

In order to configure the array into column or row arrangements, either one of the row select 842 or column select 844 lines are brought high. This causes the various tristate inverters to allow data to flow in the proper direction.

The use of tristate inverters causes the data signals to be inverted before each process test circuit. For example, if row select 842 is high, the process test circuits are arranged in a row configuration. Thus, a high data signal in row A 810 is inverted at tristate inverter 828, and flows through process test circuit 802 in a low state, is inverted to a high state at tristate inverter 836, and flows through process test circuit 806 in a high state. If the process test circuits are working properly, the result in row A output should be high. Similarly, if the data input is low at row A 810, the data output 818 should be low.

Continuing the example, if process test circuit 802 is shorted to ground, the input high signal would still result in a high signal for output 818. However, an input low signal would result in a high signal for output 818. This is because the input low signal at 810 is converted to a high signal at the tristate inverter 828, but is shorted to ground in the process test circuit 802. Thus, a low signal goes to tristate inverter 836 and is converted to high for passage through the process test circuit 806 and output 818. Using a shorthand notation, a (0,1) input to line 810 results in a (1,1) output on line 818 when process test circuit 802 is shorted to ground.

If process test circuit 806 is shorted to ground instead of process test circuit 802, the reader can see that a low input 810 and a low output 818. Similarly, a high input 810 results in a low output 818. Using the shorthand notation, a (0,1) input results in a (0,0) output.

In this example, the use of inverters may be used to indicate whether a failure is an even or odd member of the sequence, regardless of the number of process test circuits that are in the series. This arrangement allows a polarity check to be done to confirm a process test circuit failure or indicate a control circuit or data collection circuit failure.

When a failure occurs in a process test circuit, the failure will be evident in the intersection of a row and column. However, the failures for a row and column should indicate that the polarity of the failure, meaning either odd or even numbered process test circuit, corresponds with the expected row and column. Using the shorthand notation above, a (0,1) input that yields a (0,0) output indicates an even numbered process test circuit failure, i.e., the second process test circuit 806. If the results were a failure in row A and column A, the intersection appears to indicate that process test circuit 802 failed, while the row analysis indicates that only an even numbered process test circuit failed. When the results are inconsistent, a failure may have occurred in either the control circuitry, such as the various tristate inverters, or data collection circuitry not shown in the figure.

Further analyzing the example, if the data collection circuitry has been tested using self test circuitry or having successfully received and processed input data in high and low states using another path, the control circuitry may be suspect. Still analyzing the example, if the row A test of (0,1) yields a (0,0) result, indicating that process test circuit 806 failed, but the column B test of (0,1) yields a (0,1) result indicating that both process test circuits 806 and 808 are working properly, the process test circuit 806 may be assumed to be functioning properly but the control circuit may have failed.

Thus, several analysis steps may be used to analyze test data to further isolate passing and failing process test circuits from failures in control circuits or data collection circuits.

One analysis step may include looking for row failures without a corresponding column failure and vice versa. If a process test circuit actually failed, it is likely to be indicated in the intersection of a row and column failure. The failure of a row without a column failure, or a column failure without a row failure, most likely indicates the presence of a control failure and not a process test circuit failure.

Another analysis step is to correlate the expected row or column failure with the actual corresponding column or row failure when inverters are used within the series. Such a step is known as a polarity check. If the expected failure indicates an even row or column, the intersecting row or column should be even numbered. If the intersecting row or column is not evenly numbered, then a control circuit failure or data collection failure may have occurred. Those process test circuits that are not within the intersection may be assumed passing, and also the intersecting process test circuit may be assumed good.

Yet another analysis step is applicable to yield vehicles where one set of process test circuits are arranged in a layer above another set of process test circuits, such as is illustrated in FIG. 4. When a failure occurs in the same location of the upper and lower arrays, there may be an interaction or short between the upper process test circuit and the lower process test circuit. Such a situation may be specially flagged for failure analysis.

Those skilled in the arts will appreciate that these various analysis steps assume that the number of failures is relatively small. For example, in a 10×10 array, one may expect only one or two failures of process test circuits, and even fewer failures of control circuits. If there failures were much higher, the specific location of the failures may become indeterminate, since several failures may combine to appear as one failure and may give other unexpected results. In practice, the number of failures tends to be very minimal and the inventive analysis is particularly useful.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system comprising:
an optical test device capable of nondestructive inspection of an integrated circuit during the manufacturing process of said integrated circuit, said optical test device having a sensitivity threshold setting for identifying an inspection defect;
a test vehicle integrated circuit comprising a plurality of test circuits and at least one switching circuit adapted to switch one or more of said test circuits to a set of input and output connections, said test vehicle having been inspected by said optical test device and having generated a set of inspection defects;
a functional test device capable of functionally testing said test vehicle integrated circuit and producing a set of functional faults; and
an analysis device adapted to determine a physical location of said functional faults, determine a physical location of said inspection defects, and display said functional faults and said inspection defects graphically on the same diagram.

2. The system of claim 1 wherein:
said analysis device is further adapted to determine that at least some of said inspection defects do not correlate to said functional faults and changing said sensitivity threshold to capture fewer inspection defects.

3. The system of claim 1 wherein:
said optical test device is adapted to categorize said set of inspection defects into inspection defect categories;
said functional test device is adapted to categorize said set of functional faults into functional fault categories; and
said analysis device is further adapted to correlate said set of inspection defects and said set of functional faults on the basis of said inspection defect categories and said functional fault categories.

4. The system of claim 3 wherein said functional fault categories comprises at least one fault from a group composed of leakage faults, open faults, short faults, and speed faults.

5. The system of claim 3 wherein said inspection defect categories comprises at least one defect from a group composed of missing metal, additional metal, and scratches.

6. The system of claim 3 wherein said inspection defects are captured for individual layers of said test vehicle.

7. A method comprising:
manufacturing a test vehicle integrated circuit comprising a plurality of test circuits and at least one switching circuit adapted to switch one or more of said circuits to a set of input and output connections;

performing at least one nondestructive inspection of said test vehicle circuit during said manufacturing to generate a set of inspection defects, said nondestructive inspection being performed by an optical test device having a sensitivity threshold setting for identifying an inspection defect;

performing at least one functional test of said test vehicle using a functional test device to generate a set of functional faults; and displaying a physical location for said set of inspection defects and a physical location for said set of said functional faults graphically.

8. The method of claim 7 further comprising determining that at least some of said inspection defects do not correlate to said functional faults and changing said sensitivity threshold to capture fewer inspection defects.

9. The method of claim 7 further comprising determining that at least some of said functional faults do not correlate to said inspection defects and changing said sensitivity threshold to capture more inspection defects.

10. The method of claim 7 further comprising:
categorizing said inspection results into inspection defect categories;
categorizing said functional faults into functional fault categories; and
displaying said inspection results and functional results by correlating said inspection defect categories and said functional fault categories.

11. The method of claim 10 wherein said functional fault categories comprises at least one fault from a group composed of leakage faults, open faults, short faults, and speed faults.

12. The method of claim 10 wherein said inspection defect categories comprises at least one defect from a group composed of missing metal, additional metal, and scratches.

13. The method of claim 10 wherein said inspection defects are captured for individual layers of said test vehicle.

14. An analysis tool comprising:
a first input adapted to receive a set of nondestructive inspection data for a test vehicle integrated circuit, said set of nondestructive inspection data being collected during the manufacturing process of said test vehicle integrated circuit and comprising inspection defects determined using a sensitivity threshold for identifying said inspection defects, said test vehicle integrated circuit comprising a plurality of test circuits and at least one switching circuit adapted to switch one or more of said test circuits to a set of input and output connections;

a second input adapted to receive a set of functional test data for said test vehicle integrated circuit, said set of functional test data comprising functional faults; and an analysis engine adapted to determine a physical location for a plurality of said inspection defects, determine a physical location for a plurality of said functional faults, and display said physical location of said plurality of said inspection defects and said physical location of said plurality of said functional faults together on a graphical display.

15. The analysis tool of claim 14 wherein said analysis engine is further adapted to:
determine that at least some of said inspection defects do not correlate to said functional faults and change said sensitivity threshold to capture fewer inspection defects.

16. The analysis tool of claim 14 wherein said analysis engine is further adapted to:
determine that at least some of said functional faults do not correlate to said inspection defects and change said sensitivity threshold to capture more inspection defects.

17. The analysis tool of claim 14 wherein said analysis engine is further adapted to:
categorize said inspection results into inspection defect categories;
categorize said functional faults into functional fault categories; and
display said inspection results and functional results by correlating said inspection defect categories and said functional fault categories.

18. The analysis tool of claim 17 wherein said functional fault categories comprises at least one fault from a group composed of leakage faults, open faults, short faults, and speed faults.

19. The analysis tool of claim 17 wherein said inspection defect categories comprises at least one defect from a group composed of missing metal, additional metal, and scratches.

20. The analysis tool of claim 17 wherein said inspection defects are captured for individual layers of said test vehicle.

* * * * *